(12) United States Patent
Cheng et al.

(10) Patent No.: US 12,136,668 B2
(45) Date of Patent: Nov. 5, 2024

(54) HETEROSTRUCTURE INCLUDING ALTERNATING SETS OF CHANNEL AND BARRIER LAYERS

(71) Applicant: ENKRIS SEMICONDUCTOR, INC., Suzhou (CN)

(72) Inventors: Kai Cheng, Suzhou (CN); Peng Xiang, Suzhou (CN); Yu Zhu, Nantong (CN)

(73) Assignee: ENKRIS SEMICONDUCTOR, INC., Suzhou (CN)

( * ) Notice: Subject to any disclaimer, the term of this patent is extended or adjusted under 35 U.S.C. 154(b) by 674 days.

(21) Appl. No.: 17/315,665

(22) Filed: May 10, 2021

(65) Prior Publication Data

US 2021/0265495 A1    Aug. 26, 2021

Related U.S. Application Data

(63) Continuation of application No. PCT/CN2019/130513, filed on Dec. 31, 2019.

(51) Int. Cl.
*H01L 29/778* (2006.01)
*H01L 21/02* (2006.01)
(Continued)

(52) U.S. Cl.
CPC ...... *H01L 29/7786* (2013.01); *H01L 21/0217* (2013.01); *H01L 21/0254* (2013.01);
(Continued)

(58) Field of Classification Search
CPC ............ H01L 27/7786; H01L 27/2003; H01L 27/205; H01L 27/0607; H01L 27/0653; H01L 27/0657; H01L 27/1066
See application file for complete search history.

(56) References Cited

U.S. PATENT DOCUMENTS

| | | | | |
|---|---|---|---|---|
| 5,221,849 A | * | 6/1993 | Goronkin | H01L 29/772 257/E29.05 |
| 5,608,753 A | * | 3/1997 | Paoli | H01S 5/0261 257/85 |

(Continued)

FOREIGN PATENT DOCUMENTS

| | | |
|---|---|---|
| CN | 102130158 A | 7/2011 |
| CN | 102683394 A | 9/2012 |

(Continued)

OTHER PUBLICATIONS

International Search Report issued in corresponding PCT Application No. PCT/CN2019/130513, dated Sep. 27, 2020.

(Continued)

*Primary Examiner* — Ida M Soward

(74) *Attorney, Agent, or Firm* — Westbridge IP LLC

(57) ABSTRACT

A semiconductor structure includes a heterojunction, including at least two sets of channel layers and barrier layers stacked sequentially; a first p-type semiconductor, disposed in a gate region of the heterojunction and extended to a bottom of the heterojunction; and a second p-type semiconductor, disposed on the gate region of the heterojunction. By providing a heterojunction including at least two sets of channel layers and barrier layers stacked sequentially, multilayer 2DEG is realized by using multilayer channel layers and barrier layers to increase the concentration of 2DEG, thereby reducing the resistance. Since a first p-type semiconductor is disposed in a gate region of the heterojunction, the p-type semiconductor materials in the first p-type semiconductor are used to deplete the 2DEG to realize normally-off and increase the threshold voltage.

13 Claims, 8 Drawing Sheets

(51) Int. Cl.
 H01L 29/20 (2006.01)
 H01L 29/205 (2006.01)
 H01L 29/66 (2006.01)
(52) U.S. Cl.
 CPC ........ H01L 29/2003 (2013.01); H01L 29/205 (2013.01); H01L 29/66462 (2013.01)

(56) References Cited

U.S. PATENT DOCUMENTS

| | | | |
|---|---|---|---|
| 8,008,649 B2* | 8/2011 | Register, II | ....... H01L 29/66977 |
| | | | 438/285 |
| 9,419,121 B1* | 8/2016 | Teo | .................... H01L 29/7783 |
| 2002/0185655 A1* | 12/2002 | Fahimulla | ........... H01L 29/7785 |
| | | | 257/E29.05 |
| 2013/0313611 A1* | 11/2013 | Khalil | ............... H01L 29/66462 |
| | | | 257/E21.403 |
| 2017/0077283 A1 | 3/2017 | Nakata | |
| 2017/0141187 A1* | 5/2017 | Ito | ....................... H01L 23/3738 |
| 2019/0206998 A1* | 7/2019 | Huang | ............. H01L 29/66446 |
| 2021/0066355 A1* | 3/2021 | Moens | .............. H01L 21/02636 |

FOREIGN PATENT DOCUMENTS

| | | | | |
|---|---|---|---|---|
| CN | 106298903 A | | 1/2017 | |
| CN | 109980001 A | | 7/2019 | |
| DE | 102018133325 A1 * | | 6/2019 | ......... H01L 29/0634 |
| WO | WO-2013155930 A1 * | | 10/2013 | ......... H01L 29/1066 |

OTHER PUBLICATIONS

Written Opinion issued in corresponding PCT Application No. PCT/CN2019/130513, dated Sep. 27, 2020.

* cited by examiner

HETEROSTRUCTURE INCLUDING ALTERNATING SETS OF CHANNEL AND BARRIER LAYERS

CROSS-REFERENCE TO RELATED APPLICATIONS

This application is a continuation of International Application No. PCT/CN2019/130513 filed on Dec. 31, 2019, the disclosure of which is hereby incorporated by reference in its entirety.

TECHNICAL FIELD

The present application relates to the field of semiconductors, and more particularly to a structure of a normally-off device and a preparation method thereof.

BACKGROUND

Currently, in a normally-off device, a gallium nitride layer doped with p-type impurities is formed under a gate to deplete the two-dimensional electron gas (2DEG) under the gate. When a forward voltage is not applied to the gate, the concentration of 2DEG under the gate is 0, thereby realizing normally-off.

However, there are two problems with the above structure.
1. The concentration of 2DEG is low, which results in a high resistance when the device is turned on.
2. The threshold voltage is low.

SUMMARY

In view of this, the present application provides a semiconductor structure, which solves the problems of high resistance and low threshold voltage when the device mentioned above is turned on.

An embodiment of the present application discloses a semiconductor structure, including: a heterojunction including at least two sets of channel layers and barrier layers stacked sequentially; a first p-type semiconductor disposed in a gate region of the heterojunction and extended to a bottom of the heterojunction; and a second p-type semiconductor disposed on the gate region of the heterojunction.

In another embodiment, the semiconductor structure further includes: a source disposed on a source region of the heterojunction, a drain disposed on a drain region of the heterojunction, and a gate disposed above the gate region of the heterojunction.

In another embodiment, materials of the first p-type semiconductor, the second p-type semiconductor and the heterojunction include a gallium nitride based material.

In another embodiment, the semiconductor structure further includes a substrate disposed under the heterojunction.

In another embodiment, the semiconductor structure further includes a nucleation layer and a buffer layer, disposed sequentially between the substrate and the heterojunction.

In another embodiment, the semiconductor structure further includes a regrowth layer, disposed between the first p-type semiconductor and the heterojunction.

In another embodiment, the semiconductor structure further includes an in-situ insulation layer and a transition layer, which are disposed between the second p-type semiconductor and the heterojunction. The in-situ insulation layer is provided with a through recess in the gate region, and the transition layer is disposed on the in-situ insulation layer and in the through recess.

In another embodiment, the semiconductor structure further includes an insulation dielectric layer, disposed on the second p-type semiconductor and the heterojunction, and under the gate.

An embodiment of the present application also discloses a preparation method of a semiconductor structure, including: preparing a heterojunction including at least two sets of channel layers and barrier layers stacked sequentially; preparing a recess in a gate region of the heterojunction, wherein the recess extends to a bottom of the heterojunction, and the recess is filled with a first p-type semiconductor; and preparing a second p-type semiconductor and a gate on the gate region of the heterojunction sequentially.

In another embodiment, the preparation method of a semiconductor structure further includes: preparing a source and a drain on a source region and a drain region of the heterojunction respectively.

In another embodiment, the preparation method of a semiconductor structure further includes: preparing a regrowth layer on the heterojunction before filling the recess with the first p-type semiconductor.

In another embodiment, before the preparing a recess in a gate region of the heterojunction, the preparation method of a semiconductor structure further includes: preparing an in-situ insulation layer and a transition layer on the heterojunction; removing the in-situ insulation layer and the transition layer on the gate region of the heterojunction.

In another embodiment, before the preparing a recess in a gate region of the heterojunction, the preparation method of a semiconductor structure further includes: preparing an in-situ insulation layer on the heterojunction; removing the in-situ insulation layer on the gate region of the heterojunction; and preparing a transition layer covering the in-situ insulation layer and exposed heterojunction.

According to a semiconductor structure provided by the embodiments of the present application, by providing a heterojunction including at least two sets of channel layers and barrier layers stacked sequentially, multilayer 2DEG is realized by using multilayer channel layers and barrier layers to increase the concentration of 2DEG, thereby reducing the resistance. Since a first p-type semiconductor is disposed in a gate region of the heterojunction, the p-type semiconductor materials in the first p-type semiconductor are used to deplete the 2DEG to realize normally-off and increase the threshold voltage. The design of a regrowth layer may improve the reliability of the device. An in-situ insulation layer and a transition layer may reduce the gate leakage current caused by leakage from channel to the gate in the device, so the thickness of the barrier layer in the heterojunction may be smaller to increase the threshold voltage. In addition, due to the disposition of an in-situ insulation layer, the block resistance may be reduced, the concentration of 2DEG may be increased, the control ability of the gate to the channel may be improved, and the working current may be increased.

DETAILED DESCRIPTION OF THE EMBODIMENTS

Figure 1:
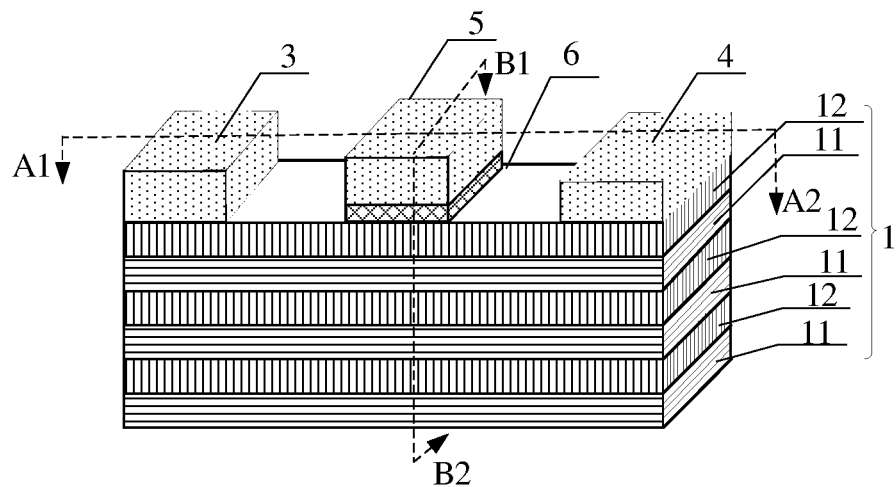
FIG. 1 is a stereogram of a semiconductor structure according to an embodiment of the present application.

A clear and complete description of technical solutions of the embodiments of the present application will be given below, in combination with the accompanying drawings in the embodiments of the present application. Apparently, the embodiments described below are a part, but not all, of the embodiments of the present application. All of other embodiments, obtained by those skilled in the art based on the embodiments of the present application without any inventive efforts, fall into the protection scope of the present application.

Furthermore, in the exemplary embodiments, because the same reference numeral represents the same component with the same structure or the same step of the same method, if an embodiment is described exemplarily, only structures or methods that are different from the described embodiment are described in other exemplary embodiments.

In the whole specification and the claims, when a component is described as being "connected" to another component, the component may be "directly connected" to another component, or "electrically connected" to another component through a third component. In addition, unless an explicit description is made to the contrary, the term "including" and its corresponding terms should only be construed as including the said component, and should not be construed as excluding any other components.

Figure 2:
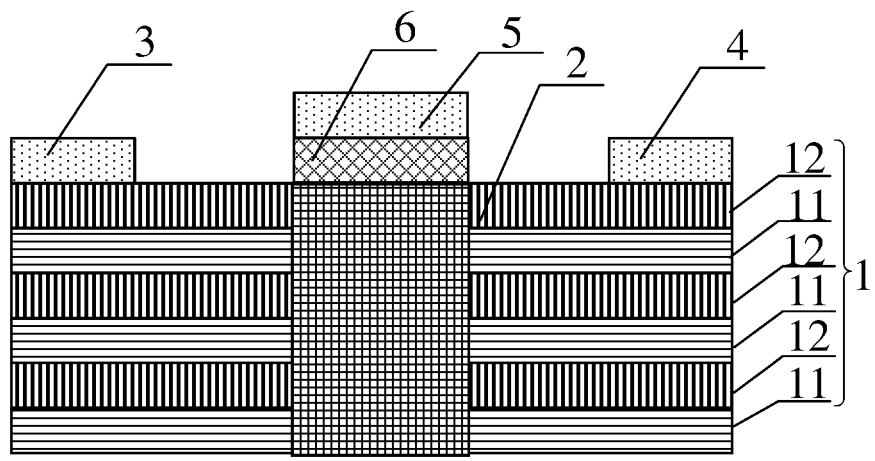
FIG. 2 is a section structure schematic diagram along A1-A2 direction in FIG. 1 according to an embodiment.
Figure 3:
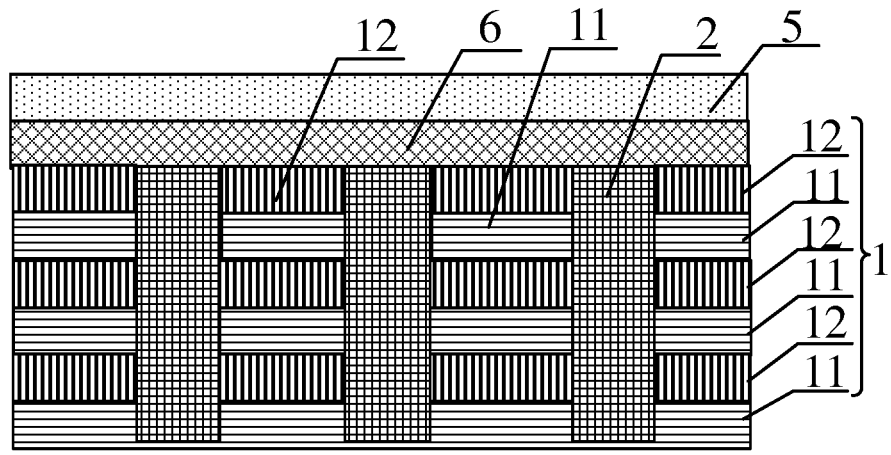
FIG. 3 is a section structure schematic diagram along B1-B2 direction in FIG. 1 according to an embodiment.

FIG. 1 is a stereogram of a semiconductor structure according to an embodiment of the present application, FIG. 2 is a section structure diagram along A1-A2 direction in FIG. 1, and FIG. 3 is a section structure diagram along B1-B2 direction in FIG. 1. As shown in FIG. 1. FIG. 2 and FIG. 3, the semiconductor structure includes: a heterojunction 1 including at least two sets of channel layers 11 and barrier layers 12 stacked sequentially, and the 2DEG may be formed between the channel layer 11 and the barrier layers 12; a first p-type semiconductor 2 disposed in a gate region of the heterojunction 1, and the first p-type semiconductor 2 extends to a bottom of the heterojunction 1; a gate 5 and a second p-type semiconductor 6 disposed on the gate region of the heterojunction 1, and the second p-type semiconductor 6 is disposed between the gate 5 and the heterojunction 1. The semiconductor structure according to an embodiment of the present application may further include a source 3 on a source region of the heterojunction 1, and a drain 4 on a drain region of the heterojunction 1.

The arrangement of multiple channel layers and barrier layers may realize multilayer 2DEG to improve the concentration of the 2DEG. The arrangement of the first p-type semiconductor and the second p-type semiconductor may deplete the 2DEG in the gate region of the heterojunction 1 to achieve a normally-off state.

In the embodiment, three first p-type semiconductors 2 are provided. It should be understood that the number of the first p-type semiconductors may be selected according to the requirements of actual application scenarios in the embodiments of the present application, and the present application is not limited thereto.

As an embodiment shown in FIG. 2 and FIG. 3, the first p-type semiconductor 2 completely penetrates the heterojunction 1, thereby realizing that the first p-type semiconductor 2 extends to the bottom of the heterojunction 1 described in the present application. It should be understood that, in other embodiments, the first p-type semiconductor 2 does not necessarily completely penetrates the heterojunction 1, that is, the first p-type semiconductor 2 may be very close to the bottom of the heterojunction 1. It only needs to realize the normally-off state required by the enhancement-mode device when the semiconductor structure of the present application is applied to the enhancement-mode device.

The heterojunction 1, the first p-type semiconductor 2 and the second p-type semiconductor 6 all include a gallium nitride based material.

Figure 4:
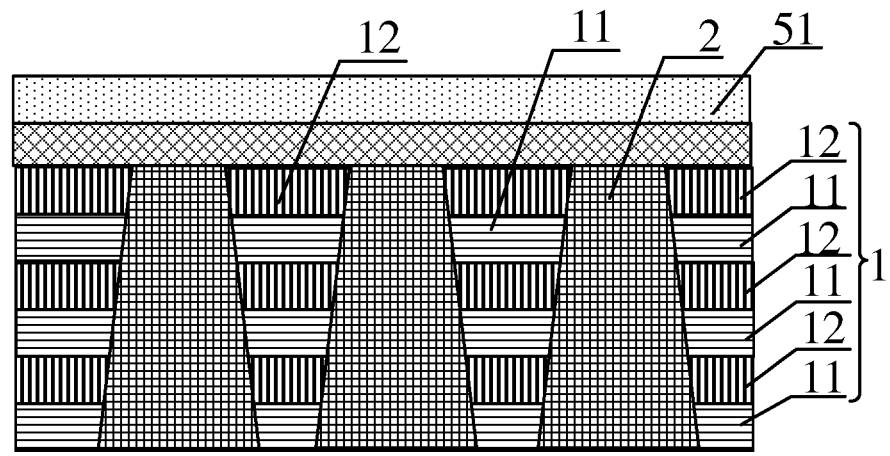
FIG. 4 is a section structure schematic diagram along the B1-B2 direction in FIG. 1 according to another embodiment.

In the above embodiment, the cross section of the first p-type semiconductor 2 is rectangular. However, the present application is not limited thereto. In another embodiment, as shown in FIG. 4, FIG. 4 is a section structure schematic diagram along B1-B2 direction of a semiconductor structure, the section shape of the first p-type semiconductor 2 may also be, for example, trapezoid, and the like. The present application is not limited to the specific cross section shape of the first p-type semiconductor 2.

Figure 5:
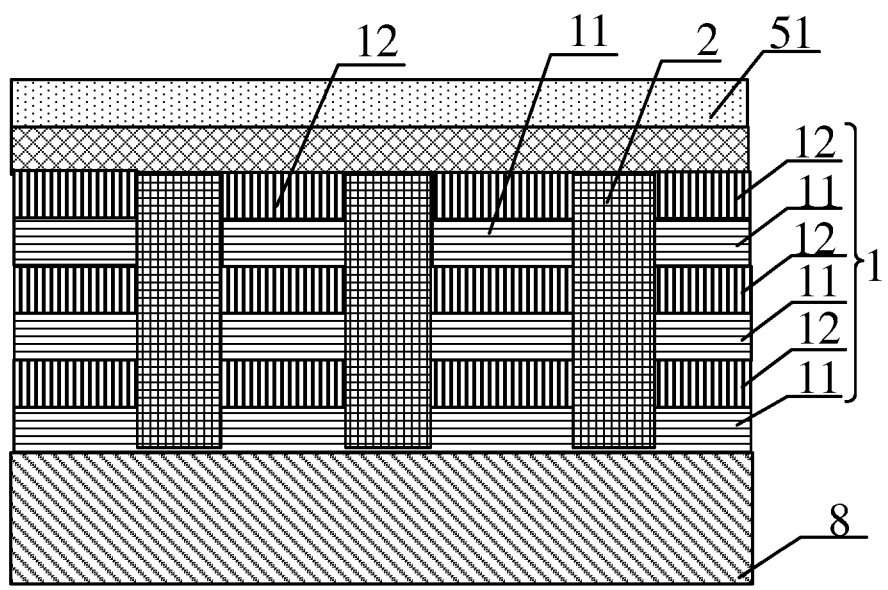
FIG. 5 is a section structure schematic diagram along the B1-B2 direction of a semiconductor structure according to another embodiment of the present application.
Figure 6:
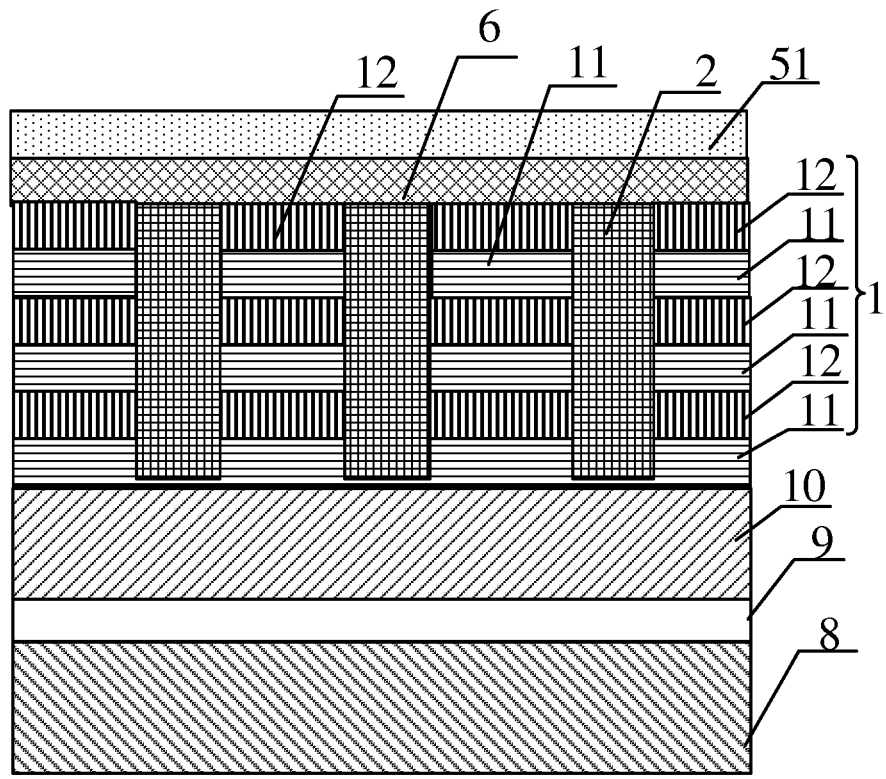
FIG. 6 is a section structure schematic diagram along the B1-B2 direction of a semiconductor structure according to another embodiment of the present application.

FIG. 5 is a section structure schematic diagram along the B1-B2 direction of a semiconductor structure according to another embodiment of the present application. The semiconductor structure may further include a substrate 8 disposed under the heterojunction 1 for supporting the heterojunction 1. FIG. 6 is a section structure schematic diagram along the B1-B2 direction of a semiconductor structure according to another embodiment of the present application. As shown in FIG. 6, a nucleation layer 9 and a buffer layer 10 are disposed between the substrate 8 and the heterojunction 1. Compared with preparing the heterojunction 1 directly on the substrate 8, the production quality of the heterojunction 1 may be improved. In an embodiment, the buffer layer 10 includes one or more combinations of the following materials: aluminum nitride, gallium nitride, aluminum gallium nitrogen, and aluminum indium gallium nitrogen. In an embodiment, the nucleation layer 9 may include one or more combinations of the following materials: aluminum nitride, gallium nitride, and aluminum gallium nitrogen. It should be understood that the material of the buffer layer may be selected according to the requirements of the actual application scenarios in the present application, and the present application is not limited to the specific material of the buffer layer.

Figure 7:
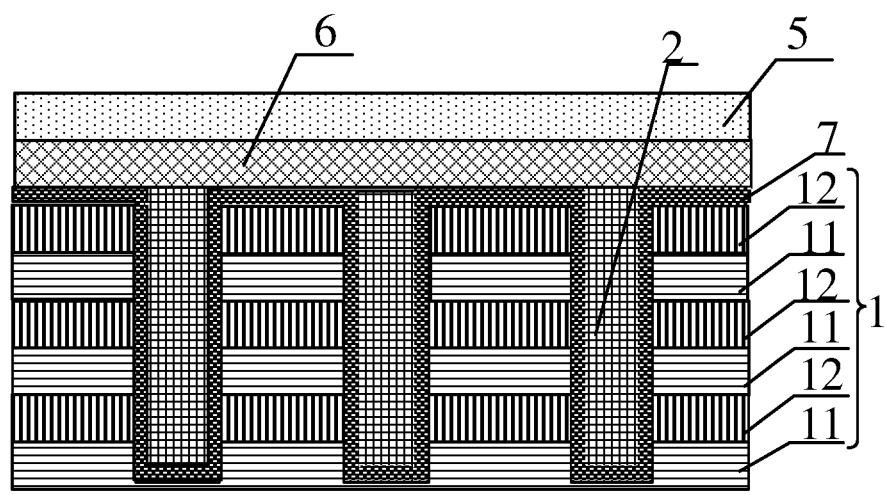
FIG. 7 is a section structure schematic diagram along the B1-B2 direction of a semiconductor structure according to another embodiment of the present application.

FIG. 7 is a section structure schematic diagram along the B1-B2 direction of a semiconductor structure according to another embodiment of the present application. As shown in FIG. 7, a regrowth layer 7 may be disposed between the first p-type semiconductor 2 and the heterojunction 1. The regrowth layer 7 is also a gallium nitride based material, and furthermore, the regrowth layer 7 may has the same material composition as the barrier layer 12 (for example, it may be aluminum gallium nitrogen material). The reliability of the device may be improved by disposing the regrowth layer 7.

Figure 8:
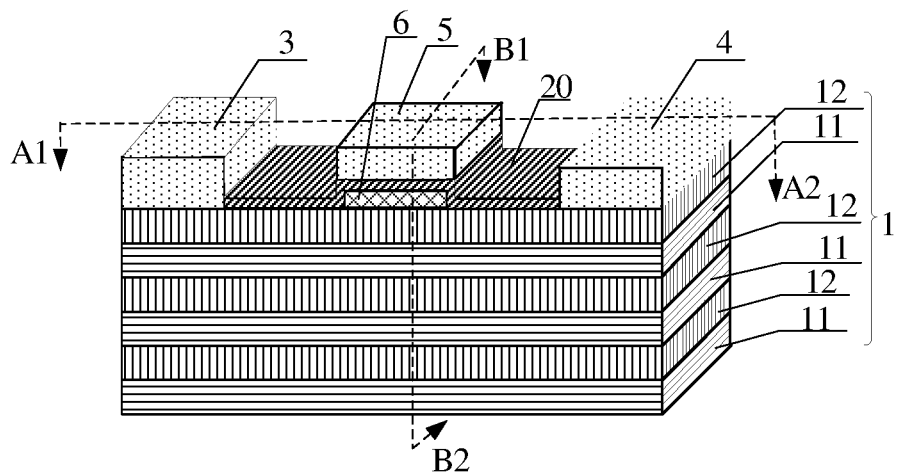
FIG. 8 is a stereogram of a semiconductor structure according to another embodiment of the present application.

FIG. 8 is a stereogram of a semiconductor structure according to another embodiment of the present application. As shown in FIG. 8, the semiconductor structure may further include an insulation dielectric layer 20, which is disposed on the second p-type semiconductor 6 and the heterojunction 1, and under the gate 5. The insulation dielectric layer 20 may be, for example, SiO2, SiN, and the like.

Figure 9A:
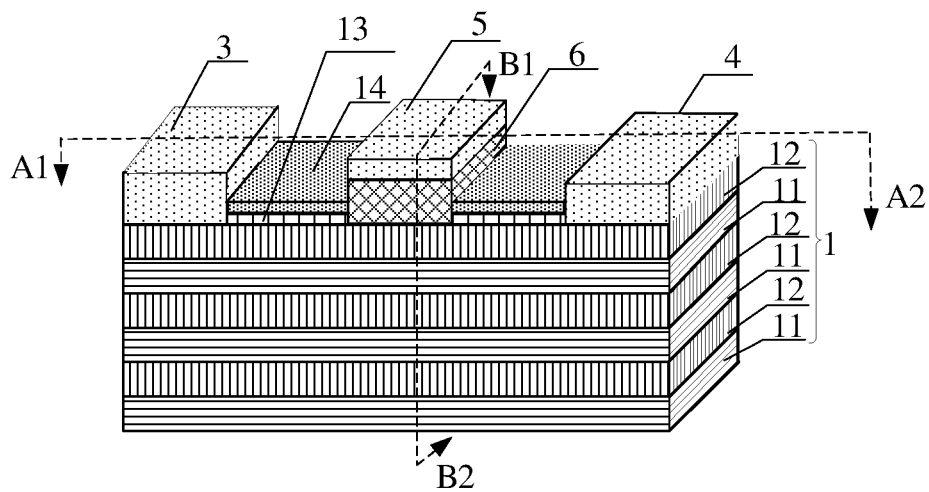
FIG. 9a to FIG. 9c are schematic diagrams of a semiconductor structure according to another embodiment of the present application.
Figure 9B:
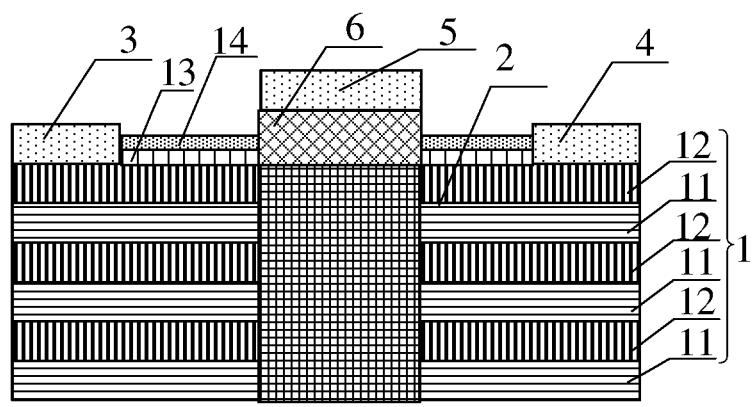
Figure 9C:
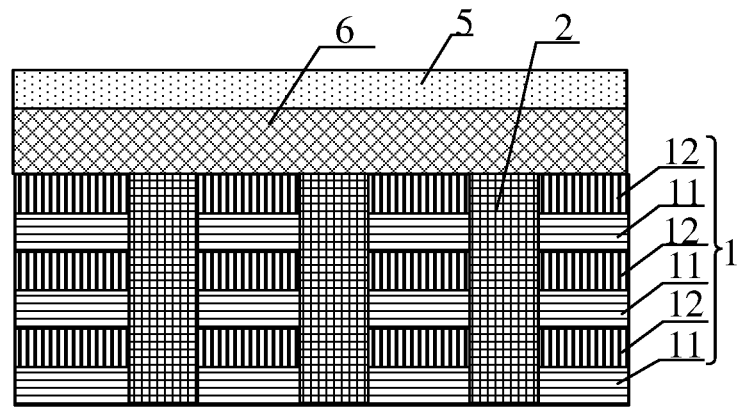
Figure 10:
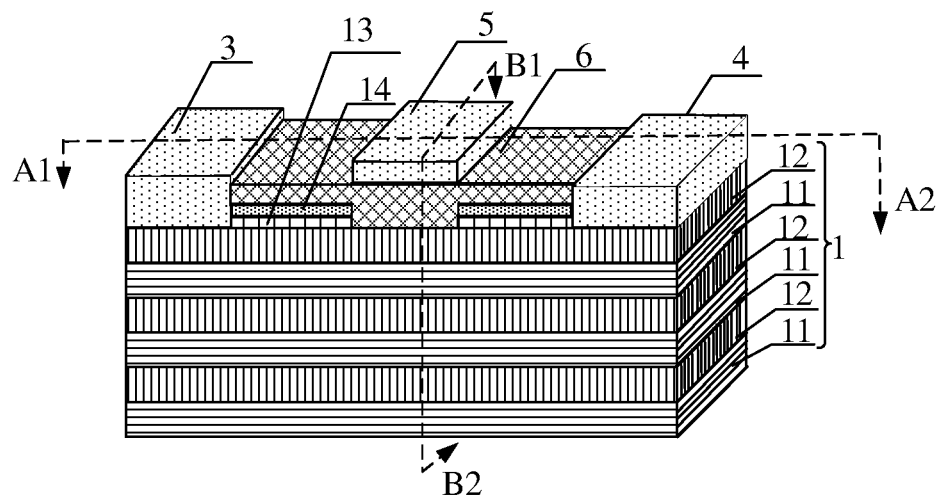
FIG. 10 is a stereogram of a semiconductor structure according to another embodiment of the present application.

FIG. 9a to FIG. 9c are schematic diagrams of a semiconductor structure according to another embodiment of the present application. FIG. 9a is a stereogram of a semiconductor structure according to another embodiment of the present application, FIG. 9b is a section structure schematic diagram along the A1-A2 direction of the semiconductor structure shown in FIG. 9a, and FIG. 9c is a section structure schematic diagram along the B1-B2 direction of the semiconductor structure shown in FIG. 9a. As shown in FIG. 9a to FIG. 9c, the semiconductor structure may further include an in-situ insulation layer 13 and a transition layer 14, which are disposed between the second p-type semiconductor 6 and the heterojunction 1. The second p-type semiconductor 6 penetrates the in-situ insulation layer 13 and the transition layer 14 to contact directly with the heterojunction 1. The material of the in-situ insulation layer 13 includes at least one of SiN and SiAlN. The material of the transition layer 14 includes at least one of AlN, SiAlN and AlGaN. A p-type semiconductor may not be prepared directly on an in-situ insulation layer with high quality, so the disposition of the transition layer can improve the high-quality preparation of the p-type semiconductor. The in-situ insulation layer and the transition layer may reduce the gate leakage current caused by leakage from the channel to the gate region in the device, so the thickness of the barrier layer in the heterojunction may be smaller to increase the threshold voltage. In addition, due to the disposition of the in-situ insulation layer the block resistance may be reduced, the concentration of 2DEG may be increased, the control ability of the gate to the channel may be improved, and the working current. Furthermore may be increased, As shown in FIG. 10, FIG. 10 is a stereogram of a semiconductor structure according to another embodiment of the present application, due to the disposition of the in-situ insulation layer 13 and the transition layer 14, the second p-type semiconductor 6 may be disposed on the transition layer 14 in the gate region, and the second p-type semiconductor 6 may also be disposed on the transition layer 14 in the region between the source and the gate and the region between the drain and the gate, so that there is no need to remove all the second p-type semiconductor 6 in regions besides the gate region when preparing the second p-type semiconductor 6 on the transition layer 14, and the craft difficulty may be reduced.

Figure 11:
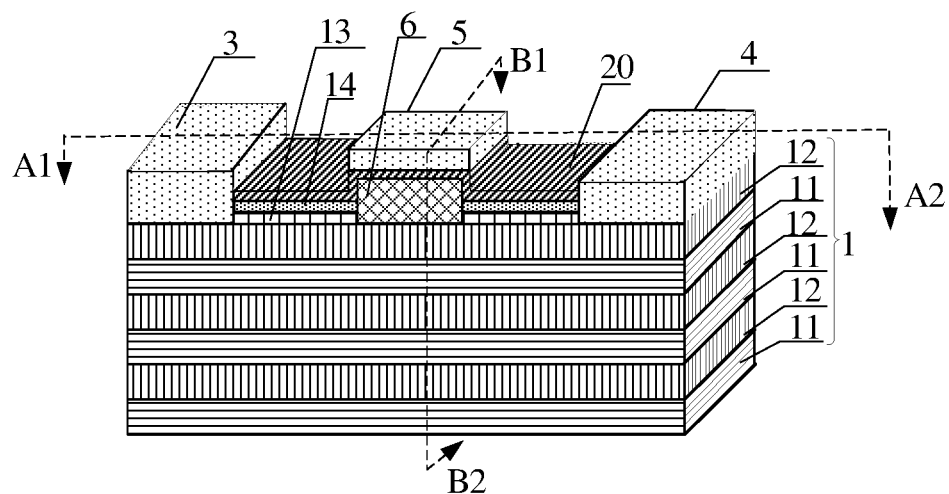
FIG. 11 is a stereogram of a semiconductor structure according to another embodiment of the present application.

FIG. 11 is a stereogram of a semiconductor structure according to another embodiment of the present application, and the difference from the embodiment shown in FIG. 9 is that, an insulation dielectric layer 20 is further disposed on the transition layer 14 and the second p-type semiconductor 6, and the insulation dielectric layer 20 is disposed under the gate 5.

Figure 12A:
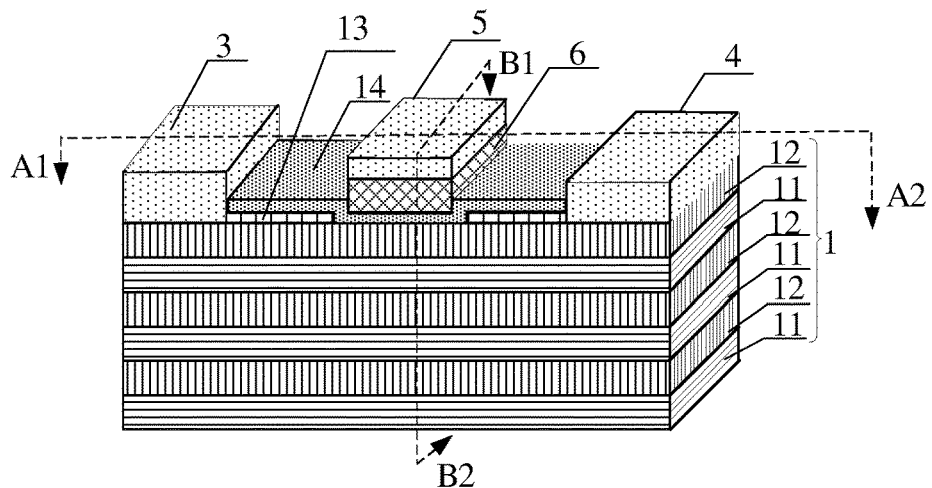
FIG. 12a to FIG. 12c are structure schematic diagrams of a semiconductor according to another embodiment of the present application.
Figure 12B:
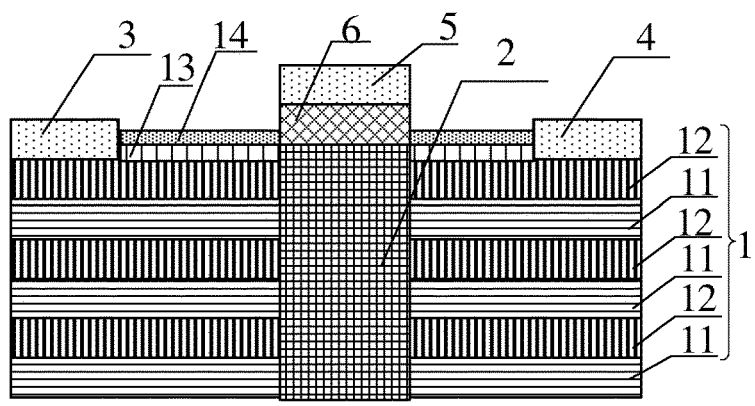
Figure 12C:
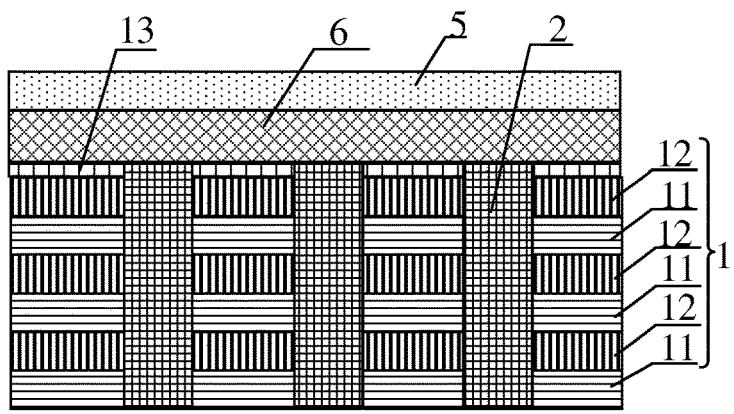

FIG. 12a to FIG. 12c are schematic diagrams of a semiconductor structure according to another embodiment of the present application. FIG. 12a is a stereogram of a semiconductor structure according to another embodiment of the present application, FIG. 12b is a section structure schematic diagram along the A1-A2 direction of the semiconductor structure shown in FIG. 12a, and FIG. 12c is a section structure schematic diagram along the B1-B2 direction of the semiconductor structure shown in FIG. 12a. The difference from the embodiment shown in FIG. 9a to FIG. 9c is that, the transition layer 14 penetrates the in-situ insulation layer 13 and contacts directly with the heterojunction 1, and the second p-type semiconductor 6 is disposed on the transition layer 14.

Figure 13:
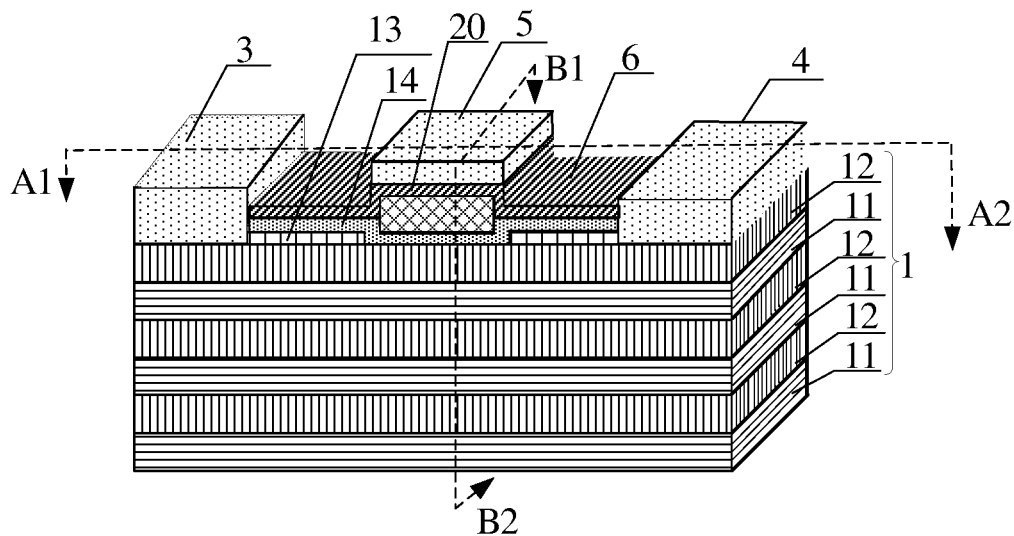
FIG. 13 is a stereogram of a semiconductor structure according to another embodiment of the present application.
Figure 14:
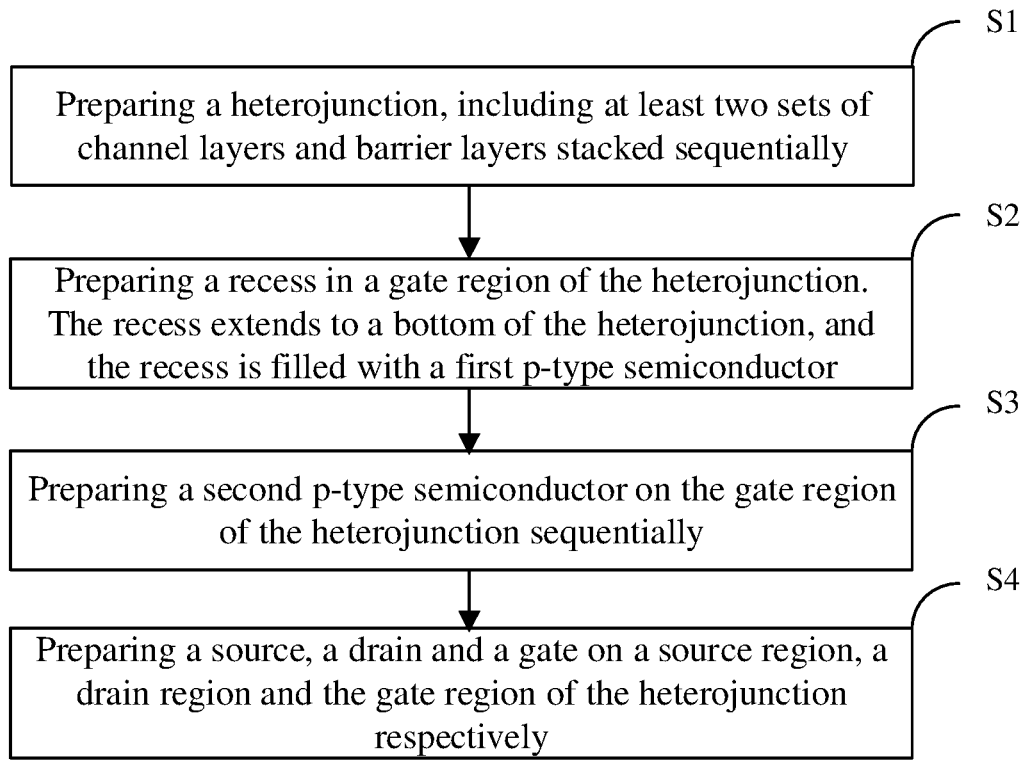
FIG. 14 is a preparation method of a semiconductor structure according to an embodiment of the present application.
Figure 15:
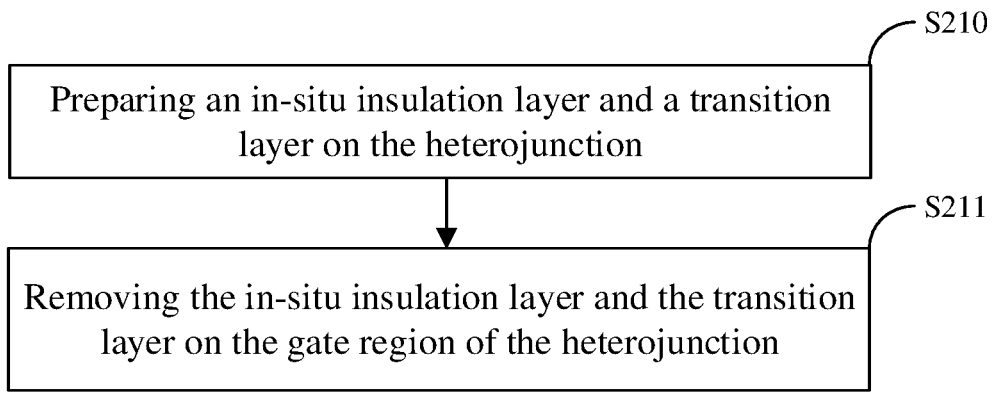
FIG. 15 is a method for preparing an in-situ insulation layer and a transition layer according to an embodiment of the present application.
Figure 16:
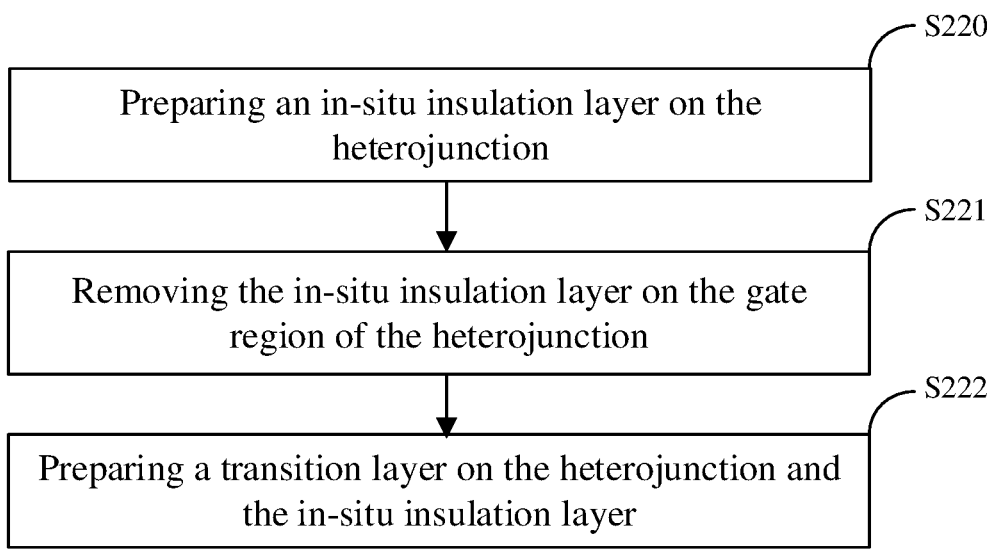
FIG. 16 is a method for preparing an in-situ insulation layer and a transition layer according to another embodiment of the present application.

FIG. 13 is a stereogram of a semiconductor structure according to another embodiment of the present application. The difference between the embodiments shown in FIG. 13 and FIG. 12a is that, an insulation dielectric layer 20 is further provided, which is disposed on the second p-type semiconductor 6 and the transition layer 14, and under the gate 5.

The present application also provides a preparation method of a semiconductor structure, and as shown in FIG. 1-FIG. 3 and FIG. 14, the preparation method includes the following steps.

Step S1, preparing a heterojunction 1, including at least two sets of channel layers 11 and barrier layers 12 stacked sequentially;

Step S2, preparing a recess in a gate region of the heterojunction 1. The recess extends to a bottom of the heterojunction 1, and the recess is filled with a first p-type semiconductor 2.

Step S3, preparing a second p-type semiconductor 6 on the gate region of the heterojunction 1 sequentially.

Step S4, preparing a source 3, a drain 4 and a gate 5 on a source region, a drain region and the gate region of the heterojunction 1 respectively.

It should be understood that the recess extends to the bottom of the heterojunction may be that, the recess penetrates the heterojunction as shown in FIG. 1 to FIG. 3, or the recess is infinitely close to the bottom of the heterojunction but not penetrate the heterojunction.

As shown in FIG. 7, in the above step S2, after preparing the recess, a regrowth layer 7 may be prepared on the heterojunction 1 before filling the recess with p-type semiconductor. The material of the regrowth layer 7 may be the same as the barrier layer 12. By disposing a regrowth layer, the influence of surface loss caused by etching process during the preparation of the recess on subsequent p-type semiconductor may be reduced, thereby improving the reliability of the device.

As shown in FIG. 8, after step S3 and before step S4, step S31 may be added: preparing an insulation dielectric layer 20, which is disposed on the second p-type semiconductor 6 and the heterojunction 1.

Additional step may be added between step S1 and step S2: preparing an in-situ insulation layer 13 and a transition layer 14. Specifically, there are two ways to implement.

The first way is shown in FIG. 9a to FIG. 9c and FIG. 15, steps S210 and S211 may be added between S1 and S2.

S210, preparing an in-situ insulation layer 13 and a transition layer 14 on the heterojunction 1.

S211, removing the in-situ insulation layer 13 and the transition layer 14 on the gate region of the heterojunction 1.

The second way is shown in FIG. 12a to FIG. 12c and FIG. 16, steps S220, S221 and S222 may be added between S1 and S2.

S220, preparing an in-situ insulation layer 13 on the heterojunction 1.

S221, removing the in-situ insulation layer 13 on the gate region of the heterojunction 1.

S222, preparing a transition layer 14 on the heterojunction 1 and the in-situ insulation layer 13.

Furthermore, when the preparation method of a semiconductor structure in the present application includes steps S210 and S211, or steps S220, S221 and S222, as shown in FIG. 11, the insulation dielectric layer 20 is prepared in step S31, and the insulation dielectric layer 20 is disposed on the transition layer 14 and the second p-type semiconductor 6.

The material of the in-situ insulation layer 13 may include at least one of SiN and SiAlN. The material of the transition layer 14 may include at least one of AlN, SiAlN and AlGaN. The in-situ insulation layer and transition layer may reduce the gate leakage current caused by leakage from the channel to the gate in the device, so the thickness of the barrier layer in the heterojunction may be smaller to increase the threshold voltage. In addition, the dispose of the in-situ insulation layer may reduce the block resistance, increase the concentration of 2DEG, improve the control ability of the gate to the channel, and increase the working current. Due to the dispose of the in-situ insulation layer 13 and the transition layer 14, the second p-type semiconductor 6 may be disposed on the transition layer 14 in the gate region, and the second p-type semiconductor 6 may also be disposed on the transition layer 14 in the region between the source and the gate and the region between the drain and the gate, so that there is no need to remove all the second p-type semiconductor 6 in regions besides the gate region when preparing the second p-type semiconductor 6 on the transition layer 14, and the craft difficulty may be reduced.

The above are only the preferred embodiments of the present application and are not configured to limit the scope of the present application. Any modifications, equivalent substitutions and so on made within the spirit and principle of the present application should be included within the scope of the present application. It should be understood that the embodiments described above may be combined arbitrarily as long as it conforms to the purpose of the present application.

What is claimed is:

1. A semiconductor structure, comprising:
   a heterojunction, comprising at least two sets of channel layers and barrier layers stacked sequentially;
   a first p-type semiconductor, disposed in a gate region of the heterojunction and extended to a bottom of the heterojunction; and
   a second p-type semiconductor, disposed on the gate region of the heterojunction.

2. The semiconductor structure of claim 1, further comprising:
   a source disposed on a source region of the heterojunction, a drain disposed on a drain region of the heterojunction, and a gate disposed above the gate region of the heterojunction.

3. The semiconductor structure of claim 2, further comprising:
   an insulation dielectric layer, disposed on the second p-type semiconductor and the heterojunction, and under the gate.

4. The semiconductor structure of claim 1, wherein materials of the first p-type semiconductor, the second p-type semiconductor and the heterojunction comprise a gallium nitride based material.

5. The semiconductor structure of claim 1, further comprising:
   a substrate, disposed under the heterojunction.

6. The semiconductor structure of claim 5, further comprising:
   a nucleation layer and a buffer layer, disposed sequentially between the substrate and the heterojunction.

7. The semiconductor structure of claim 6, wherein the nucleation layer comprises one or more combinations of the following materials: aluminum nitride, gallium nitride, and aluminum gallium nitrogen.

8. The semiconductor structure of claim 6, wherein the buffer layer comprises one or more combinations of the following materials: aluminum nitride, gallium nitride, aluminum gallium nitrogen, and aluminum indium gallium nitrogen.

9. The semiconductor structure of claim 1, further comprising:
   a regrowth layer, disposed between the first p-type semiconductor and the heterojunction.

10. The semiconductor structure of claim 1, further comprising:
    an in-situ insulation layer and a transition layer, disposed between the second p-type semiconductor and the heterojunction.

11. The semiconductor structure of claim 10, wherein the second p-type semiconductor penetrates the in-situ insulation layer and the transition layer to contact directly with the heterojunction.

12. The semiconductor structure of claim 10, wherein the transition layer penetrates the in-situ insulation layer and contacts directly with the heterojunction, and the second p-type semiconductor is disposed on the transition layer.

13. The semiconductor structure of claim 10, wherein a material of the in-situ insulation layer comprises at least one of SiN and SiAlN; and a material of the transition layer comprises at least one of AlN, SiAlN and AlGaN.

* * * * *